(12) United States Patent
Nakatani

(10) Patent No.: US 7,880,367 B2
(45) Date of Patent: Feb. 1, 2011

(54) MEMS SENSOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 149 days.

(21) Appl. No.: 12/219,450

(22) Filed: Jul. 22, 2008

(65) Prior Publication Data

US 2009/0045474 A1 Feb. 19, 2009

(30) Foreign Application Priority Data

Jul. 24, 2007 (JP) .............................. 2007-192202

(51) Int. Cl.
*H01L 41/08* (2006.01)
*H01L 29/78* (2006.01)
(52) U.S. Cl. .................... 310/331; 257/414; 257/419
(58) Field of Classification Search ................ 310/328, 310/330–332; 257/414, 419
See application file for complete search history.

(56) References Cited

U.S. PATENT DOCUMENTS

2009/0134492 A1* 5/2009 Morris et al. ............... 257/532

FOREIGN PATENT DOCUMENTS

WO WO-98/37388 8/1998

* cited by examiner

*Primary Examiner*—J. SanMartin
(74) *Attorney, Agent, or Firm*—Rabin & Berdo, PC

(57) ABSTRACT

The MEMS sensor includes a substrate, a lower thin film, opposed to a surface of the substrate at an interval, having a plurality of lower through-holes formed to pass through the lower thin film in the thickness direction thereof, an upper thin film, opposed to the lower thin film at an interval on the side opposite to the substrate, having a plurality of upper through-holes formed to pass through the upper thin film in the thickness direction thereof, and a plurality of protrusions irregularly provided on a region of the surface of the substrate opposed to the lower thin film.

10 Claims, 20 Drawing Sheets

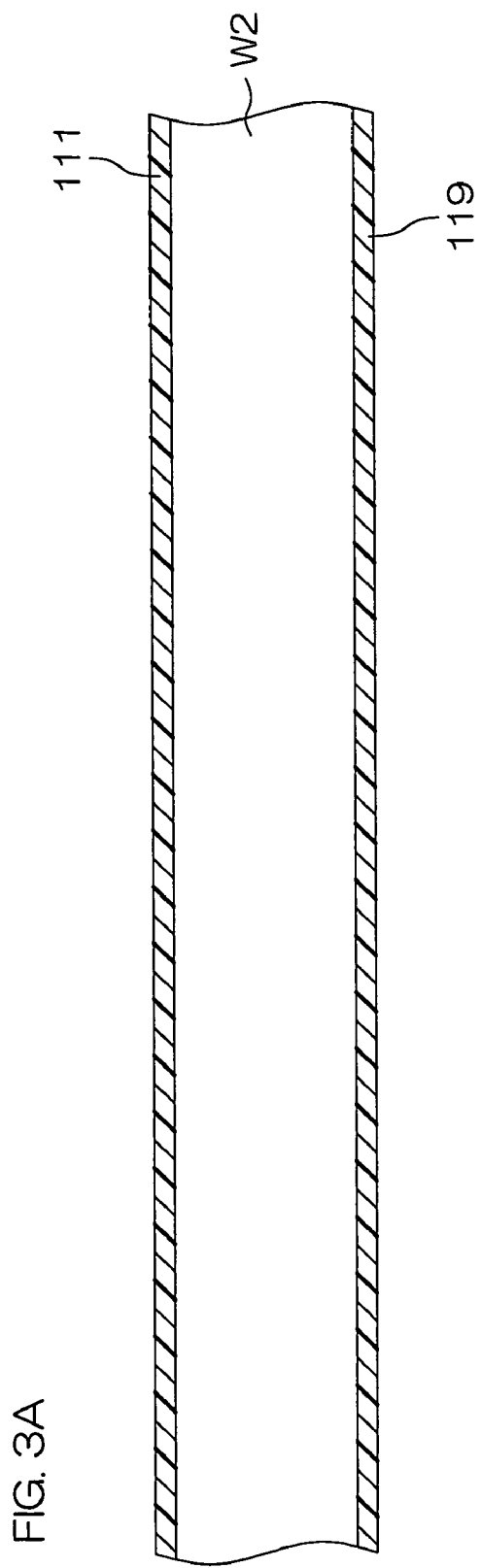

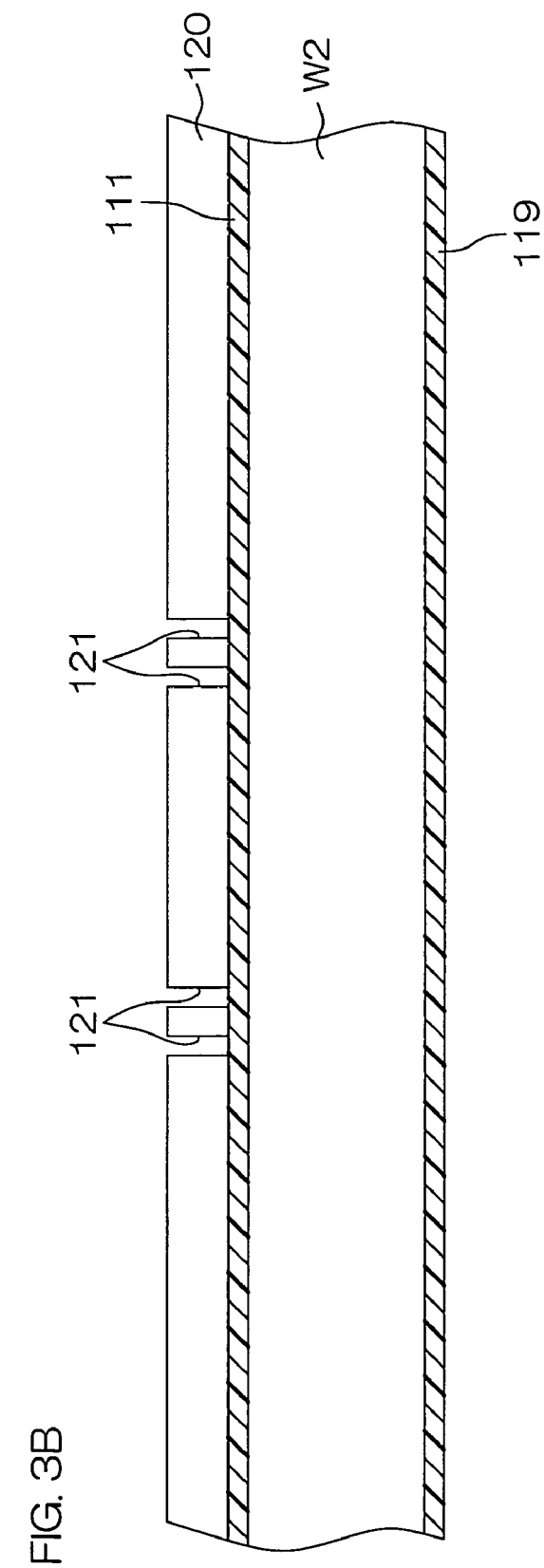

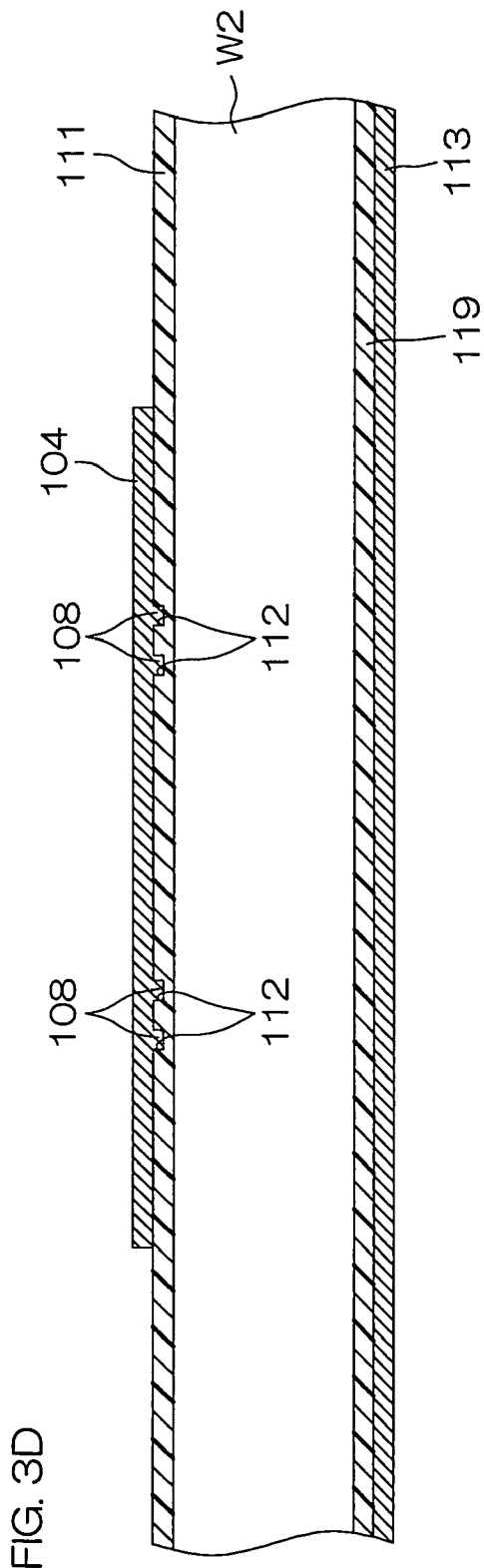

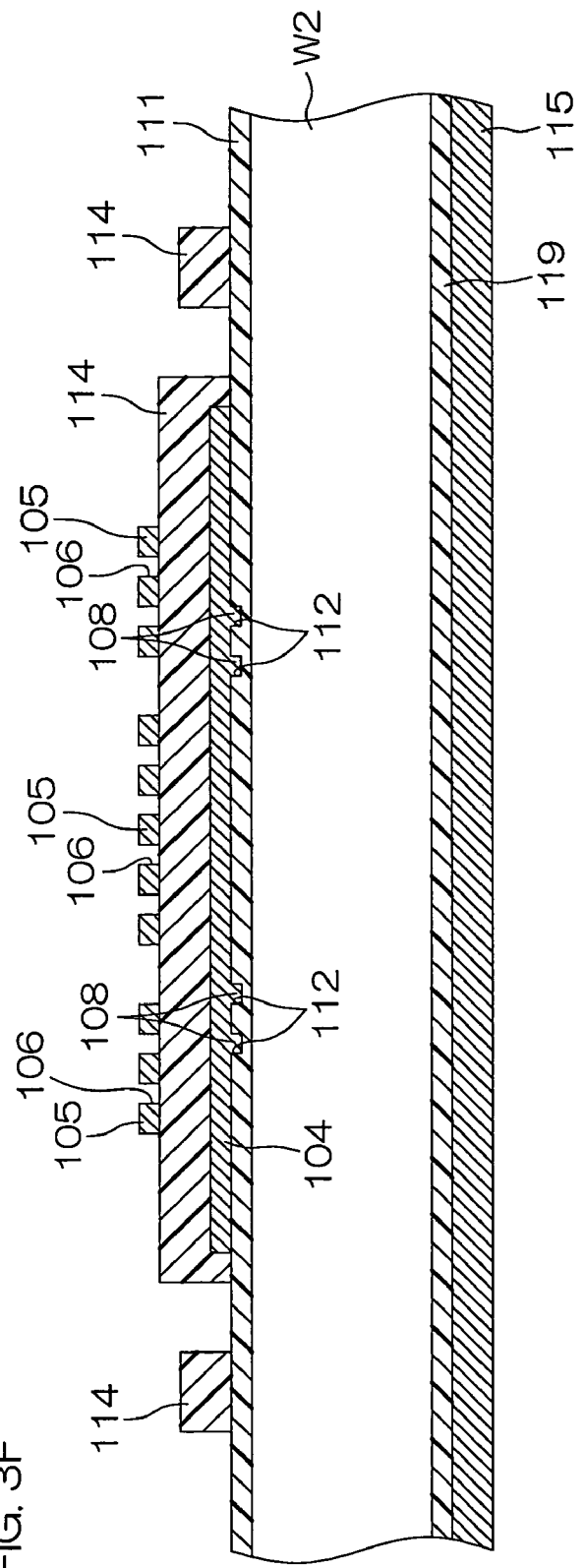

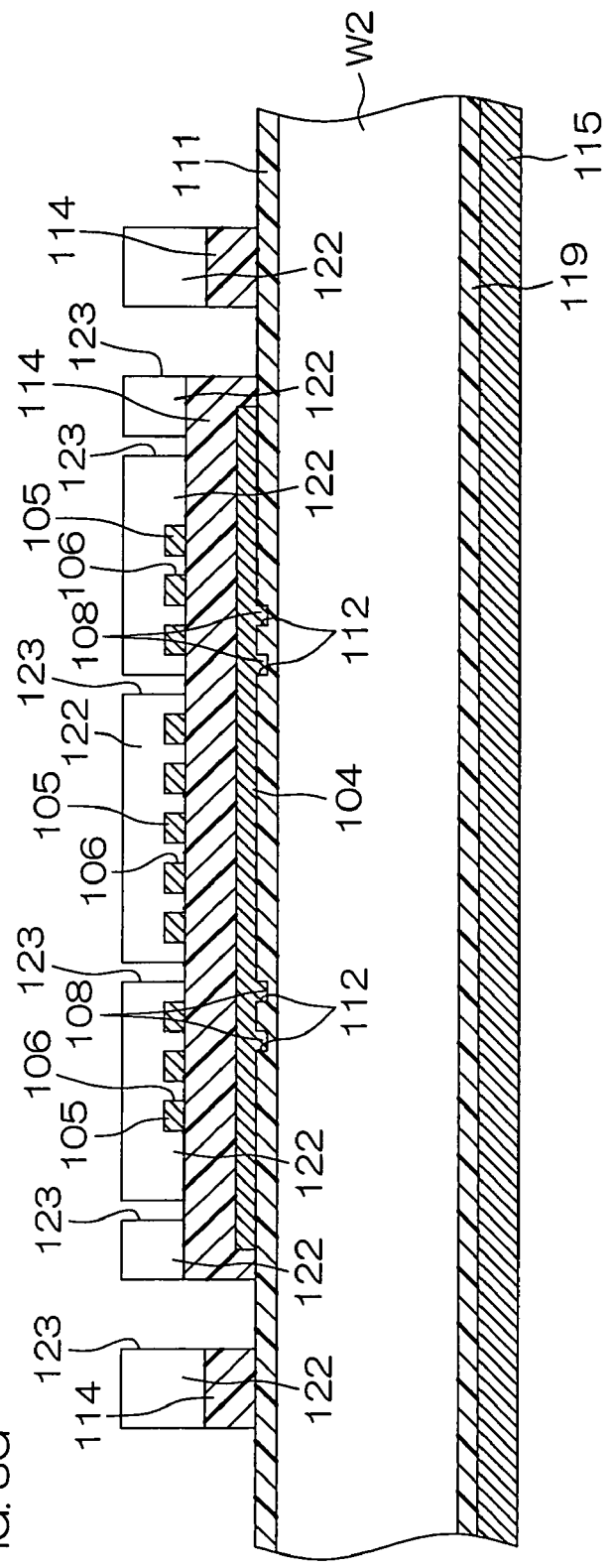

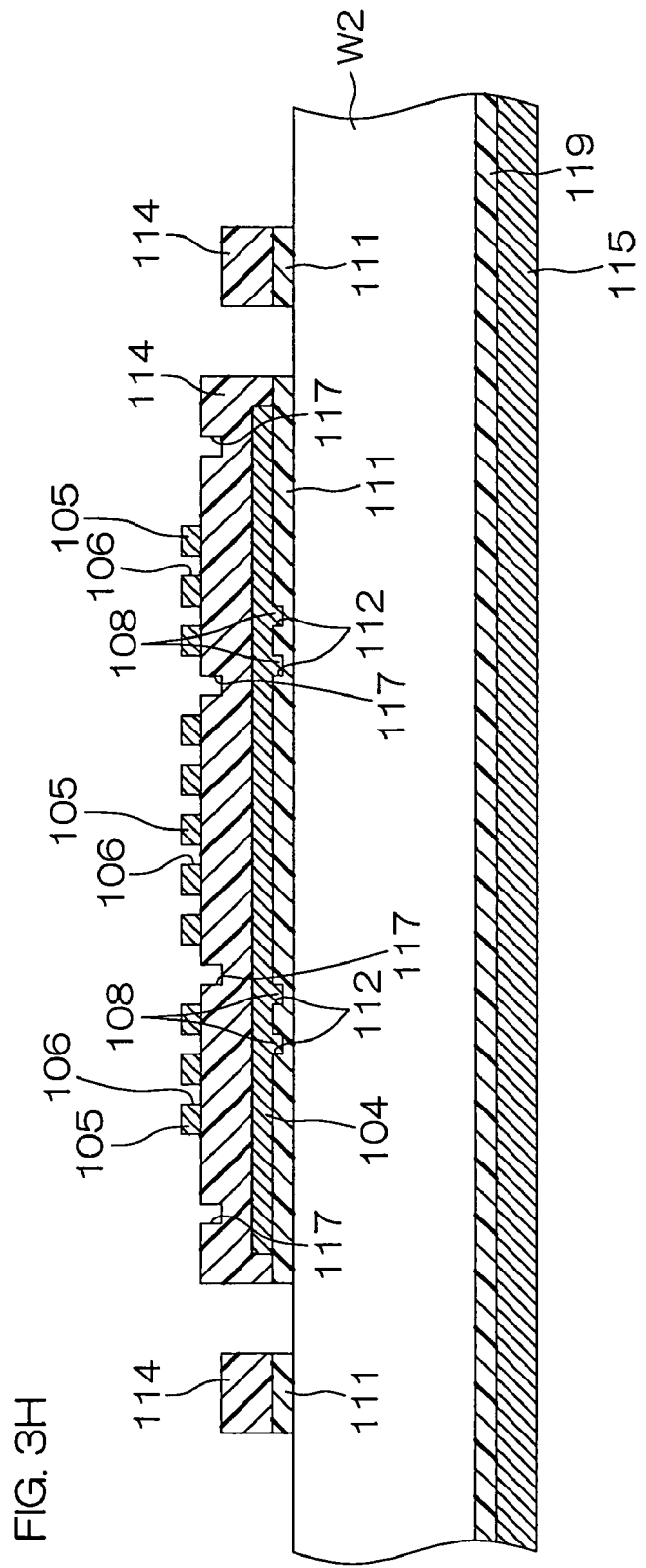

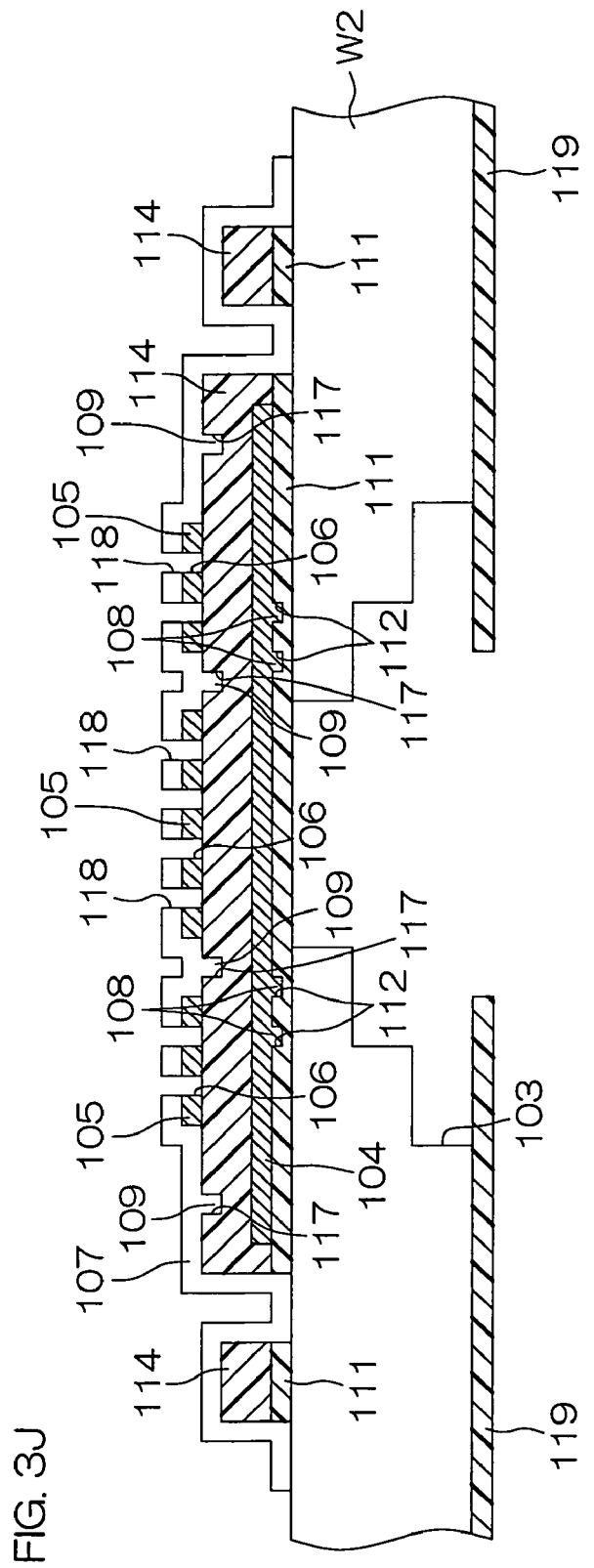

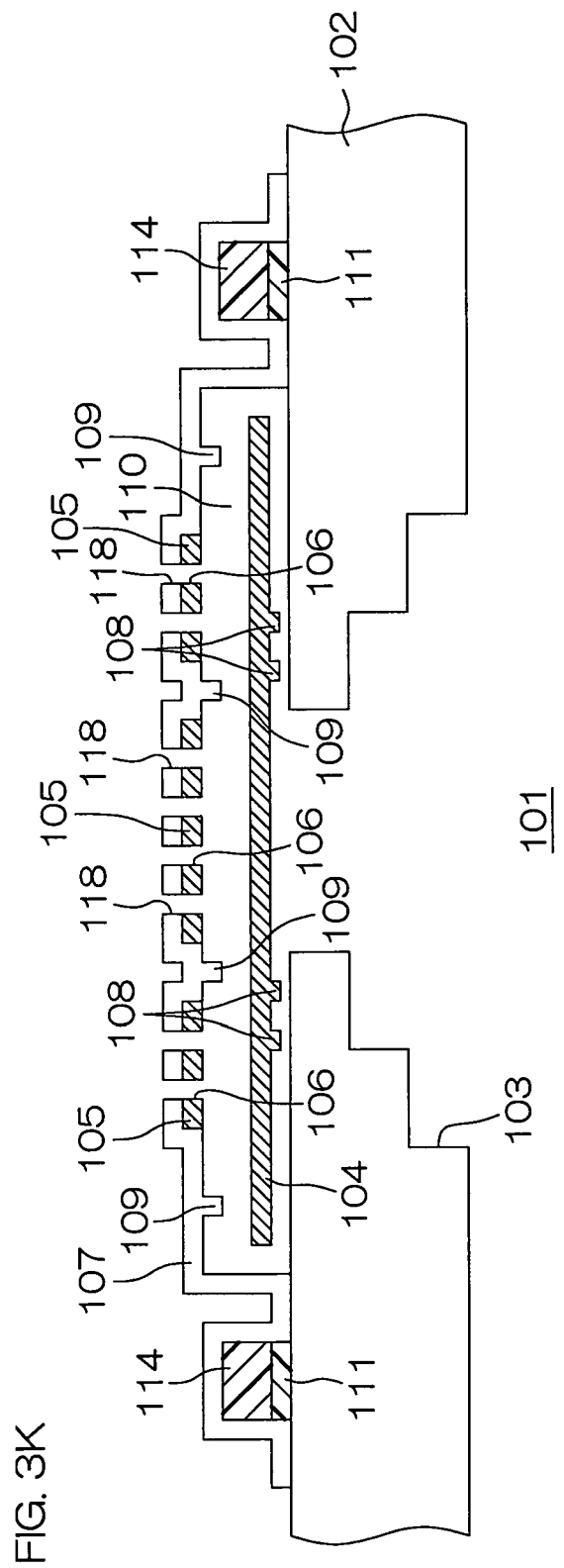

MEMS SENSOR

BACKGROUND OF THE INVENTION

1. Field of the Invention

The present invention relates to an MEMS sensor and a production method thereof.

2. Description of Related Art

In recent years, an MEMS sensor such as an Si (silicon) microphone produced by MEMS (Micro Electro Mechanical Systems) has been employed as a microphone loaded on a portable telephone or the like.

FIGS. 3A to 3K are schematic sectional views successively showing the steps of producing a conventional Si microphone 101. The method of producing the conventional Si microphone 101 and the structure thereof are now described with reference to FIGS. 3A to 3K.

In order to produce the conventional Si microphone 101, $SiO_2$ (silicon oxide) is deposited on the overall surfaces of an Si wafer W2 by thermal oxidation, as shown in FIG. 3A. Thus, a lower sacrificial layer 111 made of $SiO_2$ is formed on the upper surface of the Si wafer W2. Further, an $SiO_2$ film 119 is formed on the lower surface of the Si wafer W2.

Then, a photoresist film 120 having holes 121 of a prescribed pattern is formed on the upper surface of the lower sacrificial layer 111, as shown in FIG. 3B. The lower sacrificial layer 111 is etched through the photoresist film 120 employed as a mask, whereby a plurality of (four in FIG. 3C) recesses 112 are formed in the upper surface of the lower sacrificial layer 111, as shown in FIG. 3C. After the formation of the recesses 112, the photoresist film 120 is removed.

Then, polysilicon is deposited on the overall surfaces of the lower sacrificial layer 111 and the $SiO_2$ film 119 by LPCVD (Low Pressure Chemical Vapor Deposition). The polysilicon film covering the lower sacrificial layer 111 is doped with phosphorus, and portions of this polysilicon film other than that present on a prescribed region including the plurality of recesses 112 are thereafter removed by well-known photolithography and etching. Thus, a thin-film polysilicon plate 104 is formed on the prescribed region of the lower sacrificial layer 111, as shown in FIG. 3D. Further, a polysilicon film 113 is formed on the $SiO_2$ film 119.

Then, $SiO_2$ is deposited on the overall surfaces of the lower sacrificial layer 111 and the polysilicon plate 104 by PECVD (Plasma Enhanced Chemical Vapor Deposition). Then, unnecessary portions of the deposited $SiO_2$ film are removed by well-known photolithography and etching. Thus, an upper sacrificial layer 114 made of $SiO_2$ is formed on the polysilicon plate 104 and a region around the same, as shown in FIG. 3E.

Then, polysilicon is deposited on the lower sacrificial layer 111, the upper sacrificial layer 114 and the polysilicon film 113 by LPCVD (Low Pressure Chemical Vapor Deposition). Thus, the polysilicon film deposited on the polysilicon film 113 and the polysilicon film 113 are integrated into a polysilicon film 115, as shown in FIG. 3F. On the other hand, the polysilicon film deposited on the lower sacrificial layer 111 and the upper sacrificial layer 114 is doped with phosphorus, and thereafter patterned by well-known photolithography and etching. Thus, a back plate 105 having a large number of holes 106 is formed on the upper sacrificial layer 114, as shown in FIG. 3F.

Then, a photoresist film 122 having holes 123 of a prescribed pattern is formed on the overall region of the upper sacrificial layer 114 including the back plate 105, as shown in FIG. 3G. Then, the upper sacrificial layer 114 is etched through the photoresist film 122 employed as a mask. Thus, a plurality of (four in FIG. 3H) recesses 117 are formed in the upper surface of the upper sacrificial layer 114 while unnecessary portions (other than the portion opposed to the upper sacrificial layer 114) of the lower sacrificial layer 111 are removed, as shown in FIG. 3H. After the formation of the recesses 117, the photoresist film 122 is removed.

Then, the polysilicon film 115 is removed, and an SiN (silicon nitride) film 107 is thereafter formed on the upper region of the Si wafer W2 by PECVD, as shown in FIG. 3I.

Then, holes 118 communicating with the holes 106 of the back plate 105 respectively are formed in the SiN film 107 by well-known photolithography and etching, as shown in FIG. 3J. Thus, the upper sacrificial layer 114 is partially exposed through the holes 106 and 118. Further, an opening is formed in the portion of the $SiO_2$ film 119 opposed to the polysilicon plate 104 by well-known photolithography and etching. Then, the Si wafer W2 is etched through this opening, so that a through-hole 103 is formed in the Si wafer W2. Consequently, the lower sacrificial layer 111 is partially exposed through the through-hole 103.

Then, an etching solution capable of etching $SiO_2$ is supplied through the through-hole 103 and the holes 106 and 118, to wet-etch the upper sacrificial layer 114 and the lower sacrificial layer 111. Thus, the polysilicon plate 104 floats up from the upper surface of the Si wafer W2 while a cavity of a small interval is formed between the polysilicon plate and the back plate 105, as shown in FIG. 3K.

Thereafter the Si wafer W2 is divided into an Si substrate 102 of each device size, whereby the Si microphone is obtained with the polysilicon plate 104 and the back plate 105 opposed to each other through the cavity 110. Portions of the SiN film 107 having entered the recesses 117 of the upper sacrificial layer 114 become protrusions 109 protruding toward the polysilicon plate 104, to function as stoppers for preventing the polysilicon plate 104 and the back plate 105 from adhesion and a short circuit. Further, portions of the polysilicon plate 104 having entered the recesses 112 of the lower sacrificial layer 111 become protrusions 108 protruding toward the upper surface of the Si wafer W2, to function as stoppers for preventing the Si substrate 102 and the polysilicon plate 104 from adhesion. The polysilicon plate 104 and the back plate 105 are supported by unshown wires.

The polysilicon plate 104 and the back plate 105 form a capacitor opposed through the cavity 110. When a sound pressure (sound wave) is input in the Si microphone 101 from above the back plate 105, the polysilicon plate 104 vibrates due to this sound pressure, and the capacitor outputs an electric signal responsive to a change of the capacitance of the capacitor resulting from this vibration of the polysilicon plate 104.

When the thin-film polysilicon plate 104 vibrates or is electrostatically attracted to the Si substrate 102 and comes into contact with the Si substrate 102 over a wide contact area, the polysilicon plate 104 and the Si substrate 102 may adhere to each other. Therefore, the plurality of protrusions 108 are formed on the polysilicon plate 104. Thus, the protrusions 108 come into contact with the Si substrate 102 when the polysilicon plate 104 approaches the Si substrate 102, whereby the polysilicon plate 104 and the Si substrate 102 can be prevented from adhesion.

In order to form the protrusions 108, however, the step (see FIG. 3B) of forming the photoresist film 120 having the holes 121 on the upper surface of the lower sacrificial layer 111 and the step (see FIG. 3C) of forming the recesses 112 in the upper surface of the lower sacrificial layer 111 by etching through the photoresist film 120 serving as a mask are required, leading to a long time and much labor for the formation of the protrusions.

SUMMARY OF THE INVENTION

One aspect of the present invention may provide an MEMS sensor capable of reducing the time and labor for forming protrusions for preventing a substrate and a lower thin film from coming into contact with each other and a production method thereof.

An MEMS sensor of the present invention includes: a substrate; a lower thin film, opposed to a surface of the substrate at an interval, having a plurality of lower through-holes formed to pass through the lower thin film in the thickness direction thereof; an upper thin film, opposed to the lower thin film at an interval on the side opposite to the substrate, having a plurality of upper through-holes formed to pass through the upper thin film in the thickness direction thereof; and a plurality of protrusions irregularly provided on a region of the surface of the substrate opposed to the lower thin film.

A production method of an MEMS sensor of the present invention includes the steps of: forming a first sacrificial layer made of a mixture of a plurality of types of materials having an etching selection ratio on a surface of a substrate; forming a lower thin film having a plurality of lower through-holes extending in the thickness direction respectively on the first sacrificial layer; forming a second sacrificial layer on the lower thin film; forming an upper thin film having a plurality of upper through-holes extending in the thickness direction respectively on the second sacrificial layer; removing the second sacrificial layer through the upper through-holes by etching; and removing a prescribed material from the first sacrificial layer through the upper through-holes and the lower through-holes by etching.

The MEMS sensor according to the present invention can be prepared by the production method according to the present invention, for example.

According to this production method, the first sacrificial layer made of the mixture of the plurality of types of materials having the etching selection ratio is formed on the surface of the substrate. The lower thin film having the plurality of lower through-holes extending in the thickness direction respectively is formed on the first sacrificial layer. The second sacrificial layer is formed on the lower thin film. The upper thin film having the plurality of upper through-holes extending in the thickness direction respectively is formed on the second sacrificial layer. The second sacrificial layer is removed through the upper through-holes by etching. The prescribed material is removed from the first sacrificial layer through the upper and lower through-holes by etching after the removal of the second sacrificial layer.

The first sacrificial layer is made of the mixture of the plurality of types of materials having the etching selection ratio. When the prescribed material is removed from the first sacrificial layer, therefore, a cavity is formed between the substrate and the lower thin film, and the material other than the prescribed material contained in the first sacrificial layer remains on the surface of the substrate. Thus, a plurality of protrusions are formed on a region of the surface of the substrate opposed to the lower thin film. When the lower thin film is electrostatically attracted to the substrate, for example, the protrusions come into contact with the lower thin film, to function as stoppers for preventing the lower thin film and the substrate from adhesion.

Thus, according to this production method, the protrusions for preventing the lower thin film and the substrate from adhesion can be formed without carrying out steps of forming a photoresist film having a plurality of holes on the first sacrificial layer and forming recesses in the first sacrificial layer by etching through the photoresist film employed as a mask. In other words, the time and labor necessary for forming the protrusions can be reduced.

In this production method, the second sacrificial layer is preferably made of the prescribed material contained in the first sacrificial layer.

If the material for the second sacrificial layer and the prescribed material contained in the first sacrificial layer are identical to each other, the prescribed material can be removed from the first sacrificial layer following the removal of the second sacrificial layer with the same etching solution or etching gas through a series of steps. Consequently, the time and labor necessary for producing the MEMS sensor can be further reduced.

DETAILED DESCRIPTION OF THE INVENTION

Figure 1:
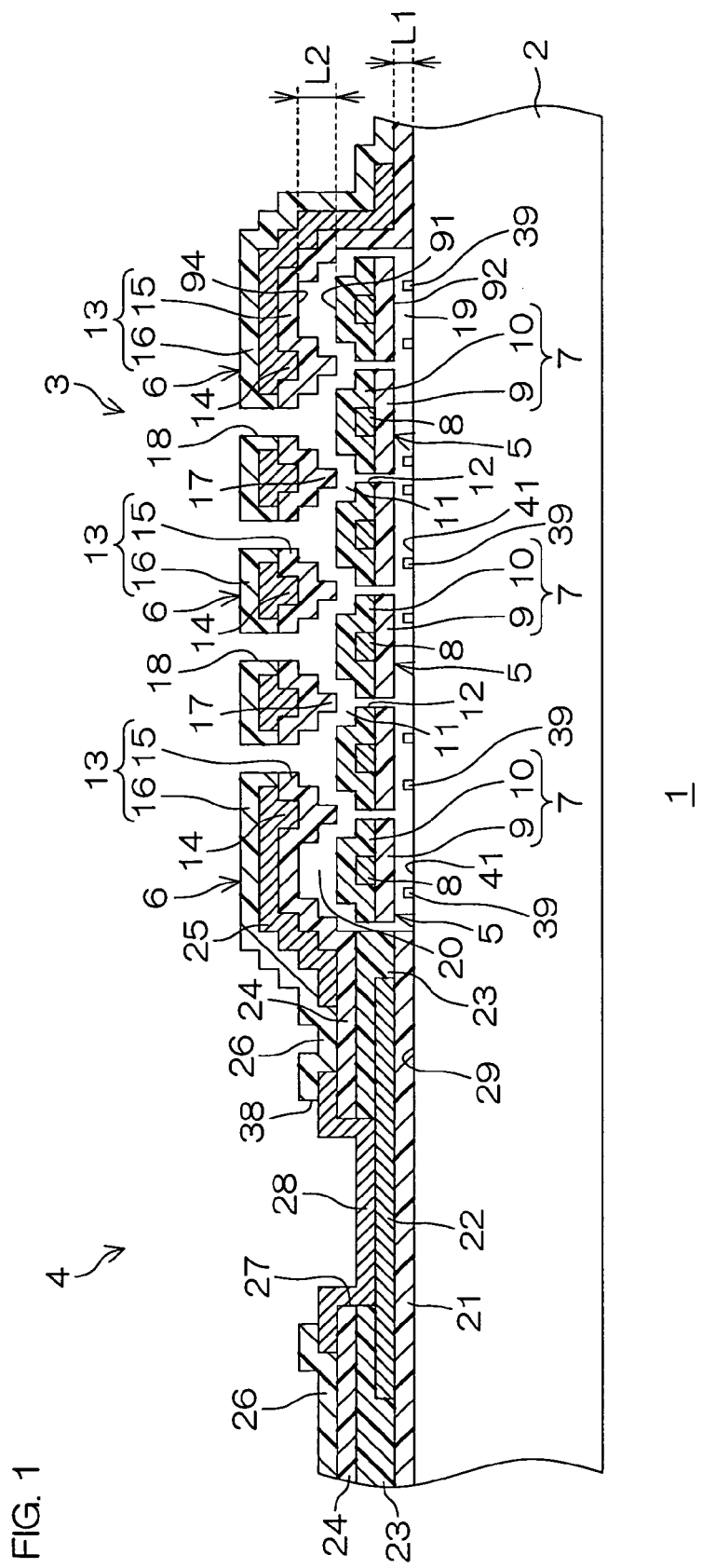
FIG. 1 is a schematic sectional view of an Si microphone according to an embodiment of the present invention.

FIG. 1 is a schematic sectional view of an Si microphone 1 according to an embodiment of the present invention.

The Si microphone 1 is a capacitance type sensor (MEMS sensor) operating by sensing a change in capacitance. This Si microphone 1 has a sensor portion 3 and a pad portion 4 on an Si substrate 2.

The sensor portion 3 senses a sound pressure input in the Si microphone 1, and outputs a change of capacitance responsive to the magnitude of the sound pressure to a wire 22 (described later) as an electric signal.

The sensor portion 3 includes a lower thin film 5 opposed to a surface (hereinafter referred to as an upper surface 29) of the Si substrate 2 at an interval and an upper thin film 6 arranged above the lower thin film 5 to be opposed thereto at an interval.

The lower thin film 5 includes a lower thin film insulating layer 7 and a lower electrode 8 covered with the lower thin film insulating layer 7.

The lower thin film insulating layer 7 includes a first insulating layer 9 forming a lower layer of the lower tin film insulating layer 7 and a second insulating layer 10 formed on the first insulating layer 9 as an upper layer of the lower thin film insulating layer 7.

The first insulating layer 9 is formed integrally with a first insulating layer 21 (described later) of the pad portion 4.

The second insulating layer 10 is formed integrally with a second insulating layer 23 (described later) of the pad portion 4. A plurality of recesses 11 are formed in the second insulating layer 10. The plurality of recesses 11 are arranged in the form of a matrix with m rows and n columns (m and n denote natural numbers) as a whole, for example.

The lower thin film insulating layer 7 is provided with lower through-holes 12 passing through the lower thin film insulating layer 7 in the thickness direction thereof from the bottom surfaces of the recesses 11. Thus, the lower thin film insulating layer 7 is in the form of a rectangular mesh in plan view, with the lower through-holes 12 provided in the form of a matrix in plan view.

The lower electrode 8 is made of a conductive material such as Au or Al, for example, and Al is applied in this embodiment. The lower electrode 8 is in the form of a rectangular mesh in plan view. This lower electrode 8 is arranged on the upper surface of the first insulating layer 9. The side surfaces and the upper surface of the lower electrode 8 are covered with the second insulating layer 10. In other words, the lower electrode 8 is held between the lower first insulating layer 9 and the upper second insulating layer 10 in the lower thin film 5, so that the overall surfaces thereof are covered with the lower thin film insulating layer 7. The second insulating layer 10 is so formed on the mesh lower electrode 8 that the surface thereof protuberates on portions opposed to the lower electrode 8 and has the recesses 11 in portions not opposed to the lower electrode 8. The lower electrode 8 is supported by the wire 22 (described later) on an unshown position at a prescribed interval from the upper surface 29 of the Si substrate 2. Thus, the lower thin film 5 formed by covering the lower electrode 8 with the lower thin film insulating layer 7 is opposed to the Si substrate 2 through a cavity 19 of a small interval L1 (the distance between the upper surface 29 of the Si substrate 2 and the lower surface 92 of the lower thin film insulating layer 7 (first insulating layer 9) is 1 μm, for example).

A plurality of (nine in FIG. 1) protrusions 39 are provided on a portion of the upper surface 29 of the Si substrate 2 facing the cavity 19. The protrusions 39 are made of Si, for example, and irregularly arranged on an opposed region 41 of the upper surface 29 of the Si substrate 2 opposed to the lower thin film 5.

The upper thin film 6 includes an upper thin film insulating layer 13 and an upper electrode 14 covered with this upper thin film insulating layer 13.

The upper thin film insulating layer 13 includes a third insulating layer 15 forming a lower layer of the upper thin film insulating layer 13 and a fourth insulating layer 16 formed on the third insulating layer 15 as an upper layer of the upper thin film insulating layer 13.

The third insulating layer 15 is formed integrally with a third insulating layer 24 (described later) of the pad portion 4. The third insulating layer 15 is provided with protrusions 17 protruding toward the recesses 11 (lower through-holes 12) on portions opposed to the recesses 11 (lower through-holes 12) in a lower surface 94 opposed to the lower thin film 5.

The fourth insulating layer 16 is formed integrally with a fourth insulating layer 26 (described later) of the pad portion 4.

The upper thin film insulating layer 13 is provided with a plurality of upper through-holes 18 passing through the upper thin film insulating layer 13 in the thickness direction thereof.

The upper through-holes 18 are arranged on positions (between the adjacent ones of the lower through-holes 12 in plan view, for example) deviating from the lower through-holes 12 respectively.

The upper electrode 14 is made of a conductive material such as Au or Al, for example, and Al is applied in this embodiment. The upper electrode 14 is in the form of a rectangular mesh in plan view. This upper electrode 14 is arranged on the third insulating layer 15. The side surfaces and the upper surface of the upper electrode 14 are covered with the fourth insulating layer 16. In other words, the upper electrode 14 is held between the lower third insulating layer 15 and the upper fourth insulating layer 16 in the upper thin film 6, so that the overall surfaces thereof are covered with the upper thin film insulating layer 13. The upper electrode 14 is supported by a wire 25 (described later) at a prescribed interval from the upper surface of the lower thin film 5 (upper surface 91 of the second insulating layer 10). Thus, the upper thin film 6 formed by covering the upper electrode 14 with the upper thin film insulating layer 13 is opposed to the lower thin film 5 through a cavity 20 of a small interval L2 (the distance between the upper surface 91 of the second insulating layer 10 and the lower surface 94 of the upper thin film insulating layer 13 (third insulating layer 15) is 4 μm, for example).

The upper thin film 6 is opposed to the lower thin film 5 through the cavity 20 of the small interval L2, and forms a capacitor whose capacitance changes due to vibration, along with the lower thin film 5. In other words, when a sound pressure (sound wave) is input in the sensor portion 3, the upper thin film 6 and/or the lower thin film 5 vibrates due to this sound pressure, and the sensor portion 3 outputs an electric signal responsive to a change of the capacitance of the capacitor resulting from this vibration of the upper thin film 6 and/or the lower thin film 5 to the wire 22 (described later).

The pad portion 4 outputs the electric signal received from the sensor portion 3 to an external wire.

The pad portion 4 includes the first insulating layer 21, the wire 22, the second insulating layer 23, the third insulating layer 24, the wire 25 and the fourth insulating layer 26.

The first insulating layer 21 is formed on the upper surface 29 of the Si substrate 2.

The wire 22 is formed on the first insulating layer 21 in a prescribed pattern. The wire 22 is formed integrally with the lower electrode 8 and electrically connected with the wire 25 on an unshown position.

The second insulating layer 23 is formed on the first insulating layer 21, and covers the wire 22 along with the first insulating layer 21.

The third insulating layer 24 is formed on the second insulating layer 23.

The wire 25 is formed on the third insulating layer 24 in a prescribed pattern. The wire 25 is formed integrally with the upper electrode 14, and electrically connected with the wire 22 on an unshown position.

The second and third insulating layers 23 and 24 are provided with an opening 27 passing through these layers 23 and 24 in the thickness direction thereof. The opening 27 is formed to partially expose the wire 22 as a bonding pad.

A metal thin film 28 covering the part of the wire 22 exposed from the opening 27 is formed on the opening 27. The metal thin film 28 is made of a conductive material such as Au or Al, for example, and Al is applied in this embodiment. An electric wire (not shown) for electrically connecting the Si microphone 1 with an external IC chip (not shown) processing the electric signal, for example, is connected to the metal thin film 28.

The fourth insulating layer 26 is formed on the third insulating layer 24. The fourth insulating layer 26 is provided with an opening 38 partially exposing the metal thin film 28.

FIGS. 2A to 2H are schematic sectional views successively showing the steps of producing the Si microphone 1 shown in FIG. 1.

In order to produce the Si microphone 1, a first sacrificial layer material is deposited on a surface (upper surface 29) of a discoidal Si wafer W1 forming the matrix of the Si substrate 2 by PECVD (Plasma Enhanced Chemical Vapor Deposition), for example. The first sacrificial layer material is made of a mixture of a plurality of types of materials having an etching selection ratio, such as Al—Si (mixture of Al and Si), Al—Si—Cu (mixture of Al, Si and Cu) or a mixture prepared by mixing granular foreign matter into an organic solvent, for example. In this embodiment, Al—Si containing Si in a mixture ratio (volume ratio) of 1% with respect to Al is employed.

Figure 2A:
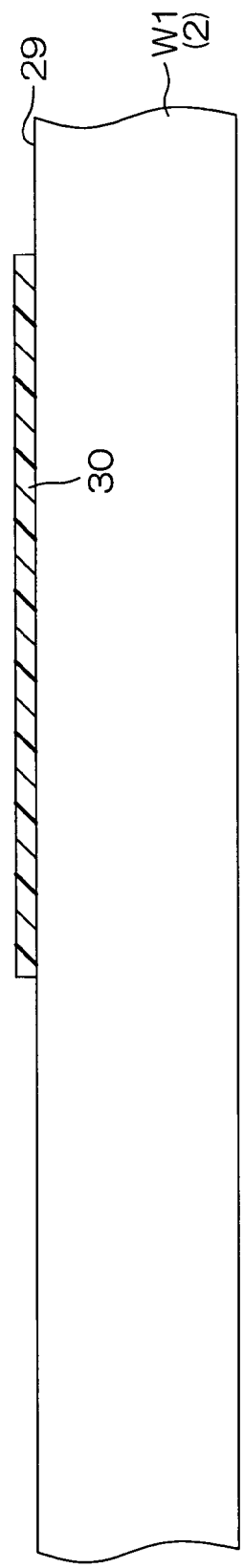
FIGS. 2A to 2H are schematic sectional views successively showing the steps of producing the Si microphone shown in FIG. 1.

Then, this Al—Si film is patterned by well-known photolithography and etching to form a lower sacrificial layer 30 made of Al—Si, as shown in FIG. 2A (step of forming a first sacrificial layer).

Figure 2B:
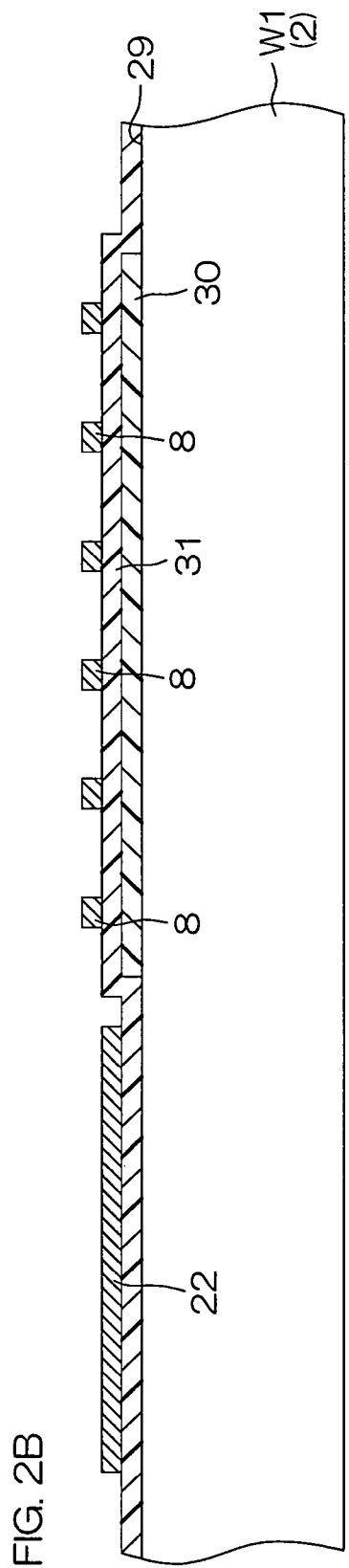

Then, a first insulating layer 31 made of $SiO_2$ is formed on the overall region of the Si wafer W1 including the lower sacrificial layer 30 by PECVD, for example. Then, an Al film is formed on the overall region of the first insulating layer 31 by sputtering, for example. Then, this Al film is patterned by well-known photolithography and etching. Thus, the lower electrode 8 in the form of a mesh in plan view is formed on a position of the upper surface of the first insulating layer 31 opposed to the Si wafer W1 through the lower sacrificial layer 30, as shown in FIG. 2B. On the other hand, the wire 22 of the prescribed pattern is formed on the portion of the first insulating layer 31 directly formed on the upper surface 29 of the Si wafer W1.

Figure 2C:
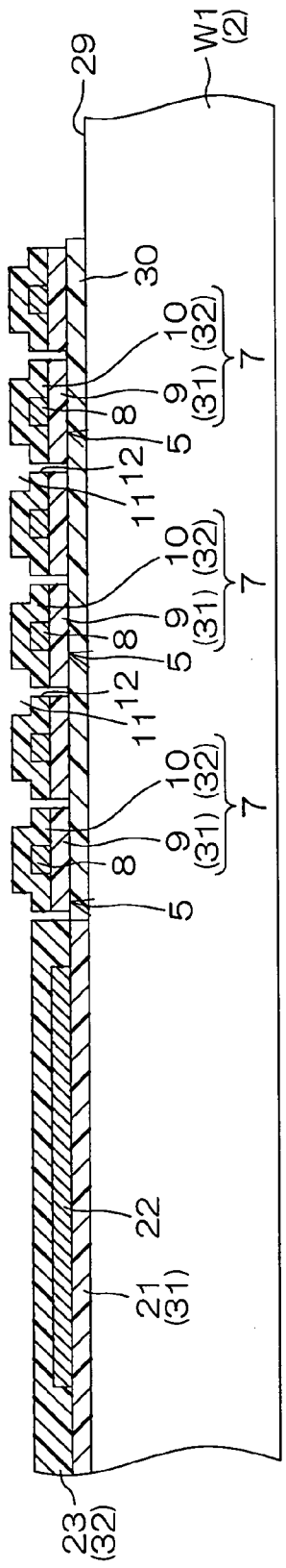

Then, a second insulating layer 32 is formed on the overall region of the first insulating layer 31 including the wire 22 and the lower electrode 8 by PECVD, for example. At this time, portions of the second insulating layer 32 (second insulating layer 10) located on the lower electrode 8 protrude by the thickness of the lower electrode 8, whereby the recesses 11 are formed between the adjacent ones of the protruding portions. Then, the second insulating layer 32 and the first insulating layer 31 are patterned by well-known photolithography and etching, whereby the lower through-holes 12 are formed to extend from the bottom surfaces of the recesses 11 toward the lower sacrificial layer 30 in the thickness direction. Thus, the portion of the first insulating layer 31 located on the lower sacrificial layer 30 becomes the first insulating layer 9, and the portion of the second insulating layer 32 located on the first insulating layer 9 becomes the second insulating layer 10. The lower thin film 5 having the structure obtained by covering the lower electrode 8 with the lower thin film insulating layer 7 consisting of the first and second insulating layers 9 and 10 is formed on the lower sacrificial layer 30 in this manner, as shown in FIG. 2C (step of forming a lower thin film).

On the other hand, the portion of the first insulating layer 31 directly formed on the upper surface 29 of the Si wafer W1 becomes the first insulating layer 21, and the portion of the second insulating layer 32 located on the first insulating layer 21 becomes the second insulating layer 23 covering the wire 22 along with the first insulating layer 21.

Figure 2D:
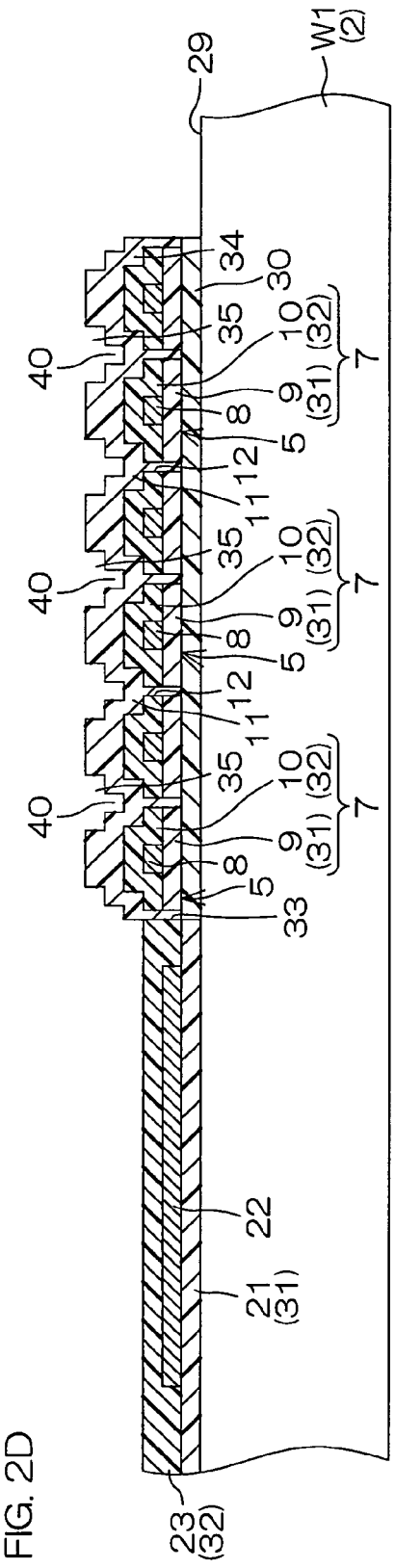

Then, Al is deposited on the overall region of the Si wafer W1 by PECVD, for example. This Al is deposited up to a height for filling up the lower through-holes 12 and a clearance 33 between the lower tin film insulating layer 7 and the second insulating layer 23 and completely covering the lower thin film 5. Then, this Al film is patterned by well-known photolithography and etching. Thus, an upper sacrificial layer 34 made of Al is formed as shown in FIG. 2D (step of forming a second sacrificial layer). At this time, recesses 35 are formed in the upper sacrificial layer 34 on positions opposed to the recesses 11, due to the recesses 11 formed in the second insulating layer 10 of the lower thin film 5. Further, recesses 40 dented from the bottom surfaces of the recesses 35 by one step are formed in the upper sacrificial layer 34, due to the lower through-holes 12 formed in the lower thin film insulating layer 7.

Figure 2E:
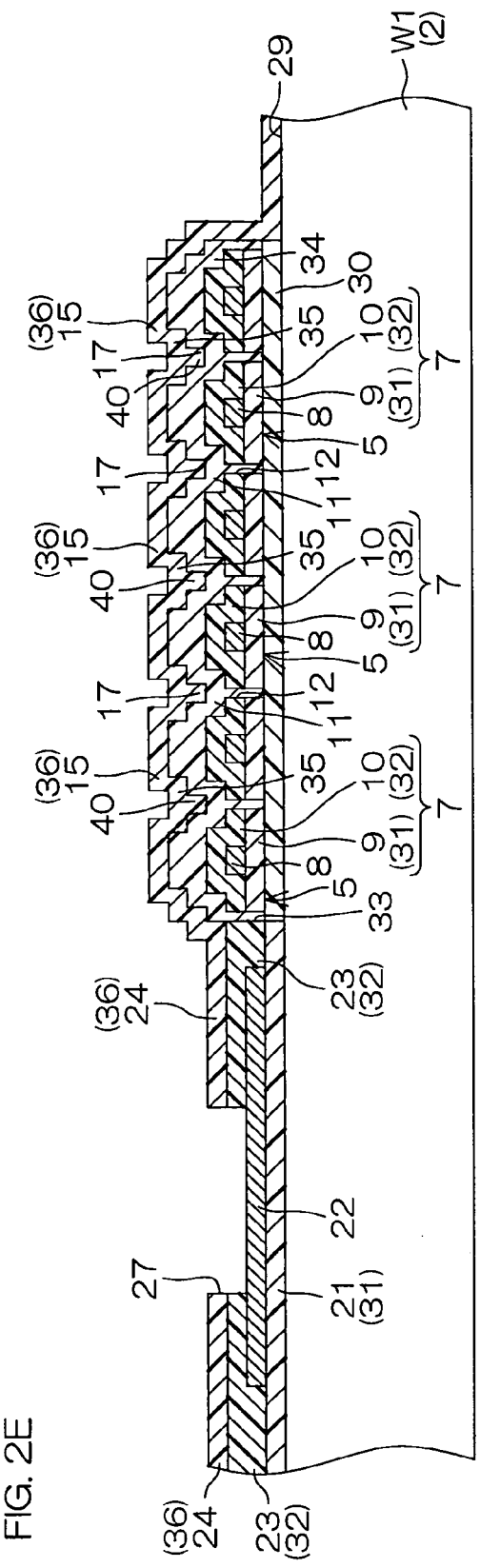

After the formation of the upper sacrificial layer 34, $SiO_2$ is deposited on the overall region of the Si wafer W1 including the upper sacrificial layer 34 by PECVD, for example. This $SiO_2$ is deposited up to a height for entering the recesses 40 and 35 and completely covering the upper sacrificial layer 34. Thus, a third insulating layer 36 is formed by the third insulating layer 15 provided on the upper sacrificial layer 34 and the third insulating layer 24 provided on the second insulating layer 23, as shown in FIG. 2E. Thereafter the third insulating layer 24 and the second insulating layer 23 are partially removed by well-known photolithography and etching, for forming the opening 27 partially exposing the wire 22 as the bonding pad.

Figure 2F:
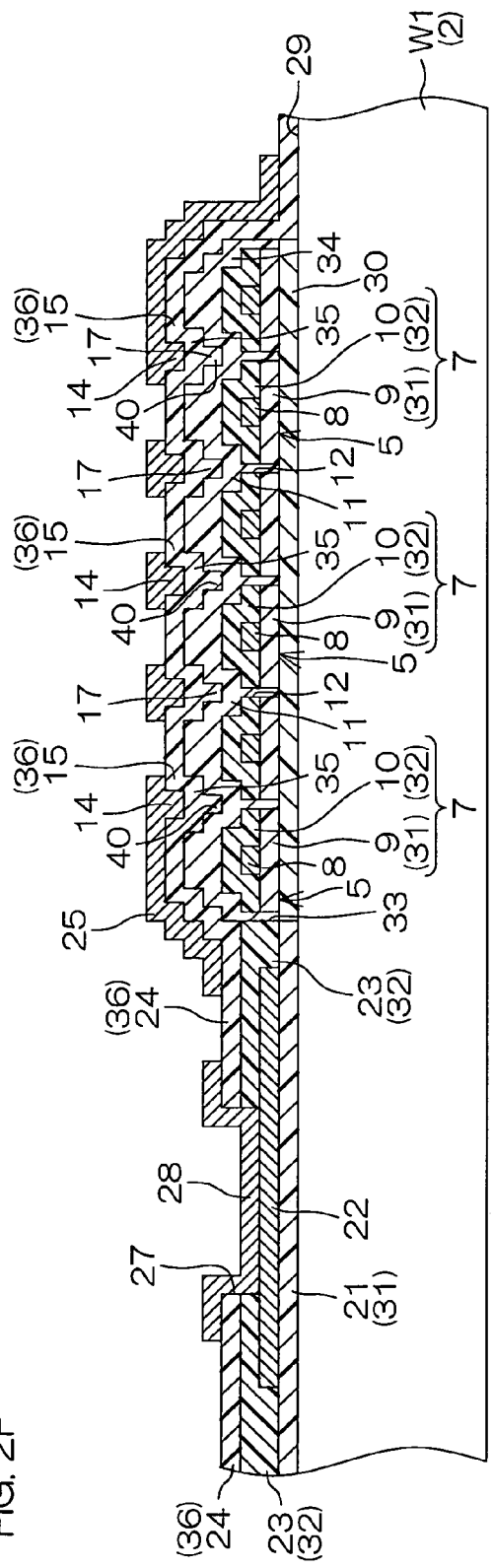

Then, an Al film is formed on the overall region of the third insulating layer 36 by sputtering, for example. Then, the Al film is patterned by well-known photolithography and etching. Thus, the upper electrode 14 in the form of a mesh in plan view is formed on a position of the upper surface of the third insulating layer 15 opposed to the lower thin film 5 through the upper sacrificial layer 34, as shown in FIG. 2F. On the other hand, the wire 25 of the prescribed pattern is formed on the upper surface of the third insulating layer 24. Further, the metal thin film 28 covering the part of the wire 22 exposed from the opening 27 is formed on the opening 27.

Figure 2G:
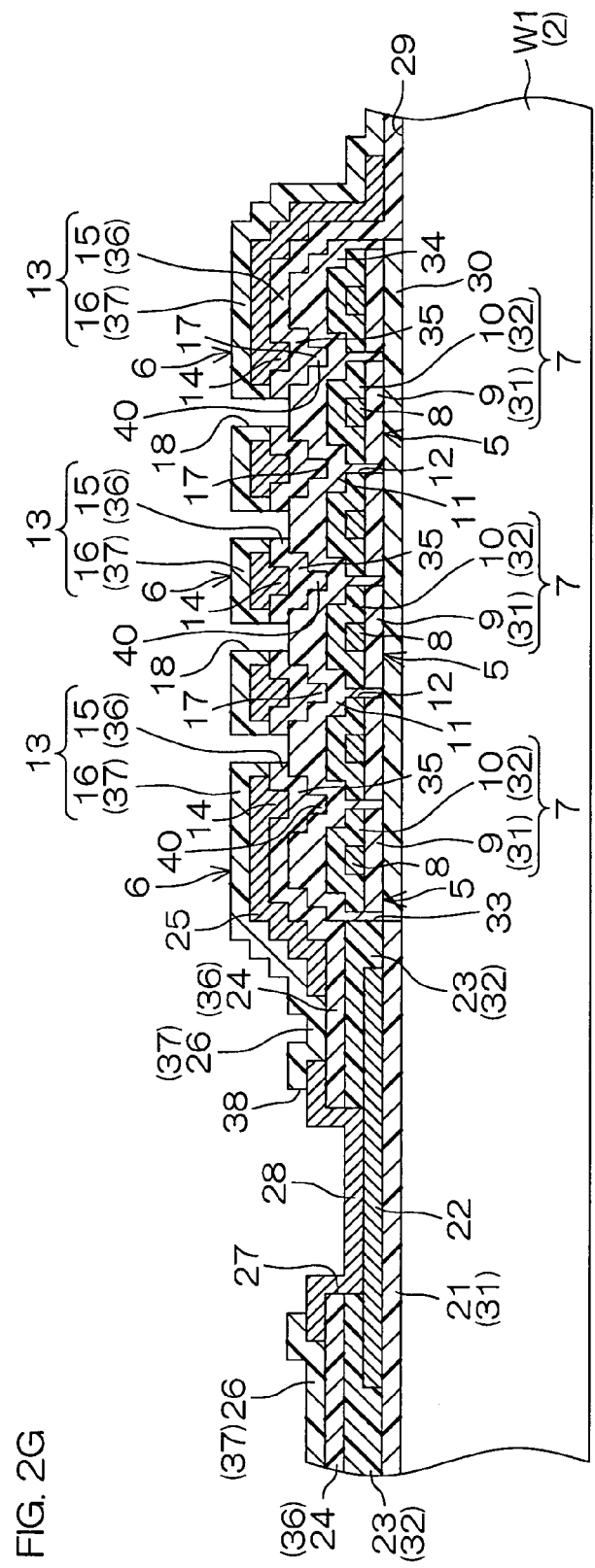

Then, $SiO_2$ is deposited on the overall region of the third insulating layer 36 including the upper electrode 14, the wire 25 and the metal thin film 28 by PECVD, for example. Thus, a fourth insulating layer 37 is formed by the fourth insulating layer 16 provided on the third insulating layer 15 and the fourth insulating layer 26 provided on the third insulating layer 24. Then, the fourth insulating layer 37 and the third insulating layer 36 are patterned by well-known photolithography and etching. Thus, the upper through-holes 18 arranged on the positions deviating from the lower through-holes 12 are formed in the fourth insulating layer 16 and the third insulating layer 15 to extend in the thickness direction thereof up to the upper sacrificial layer 34, as shown in FIG. 2G. The upper thin film 6 having the structure obtained by covering the upper electrode 14 with the upper thin film insulating layer 13 consisting of the third and fourth insulating layers 15 and 16 is formed on the lower thin film 5 in this manner (step of forming an upper thin film). Further, the opening 38 partially exposing the metal thin film 28 is formed in the fourth insulating layer 26.

Figure 2H:
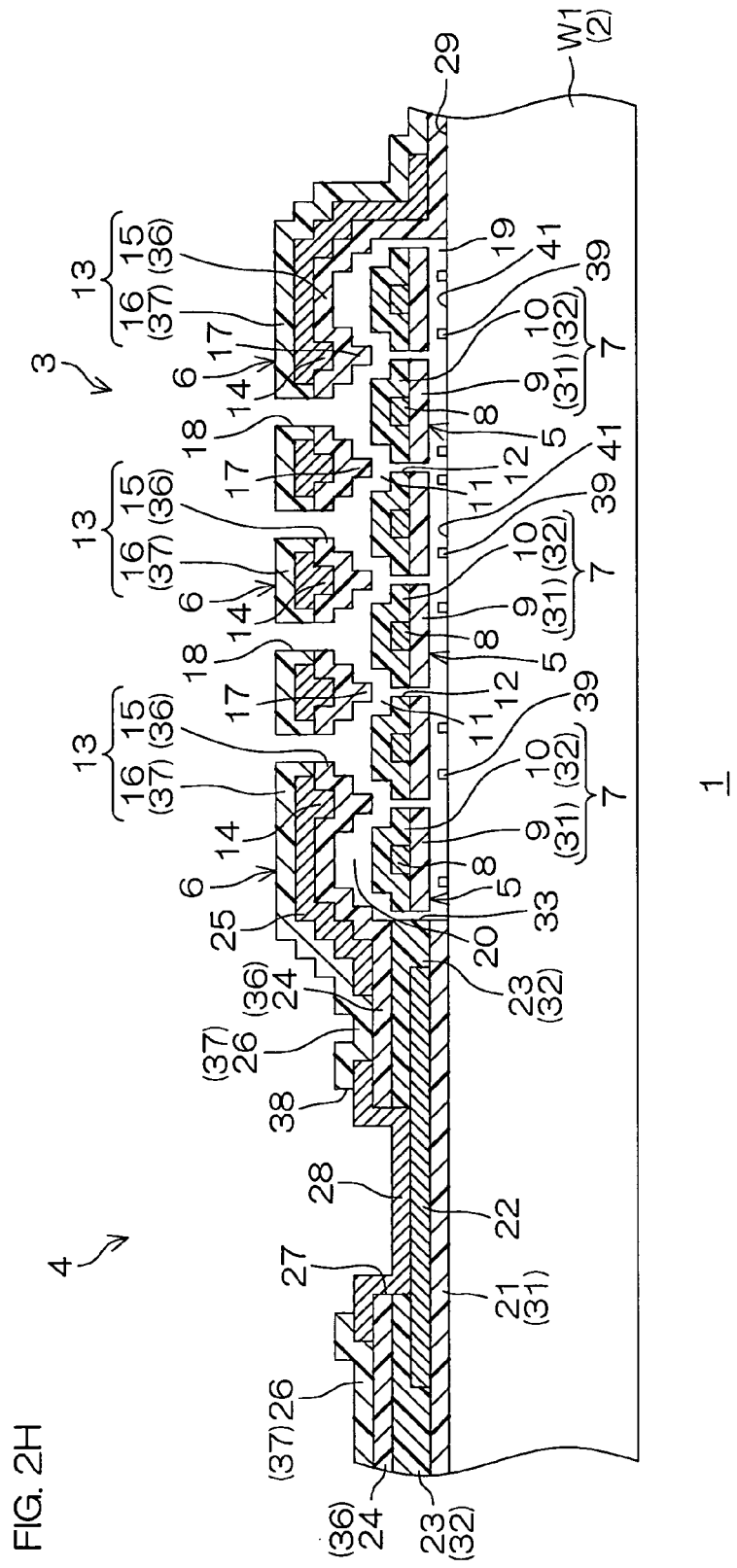
Figure 3C:
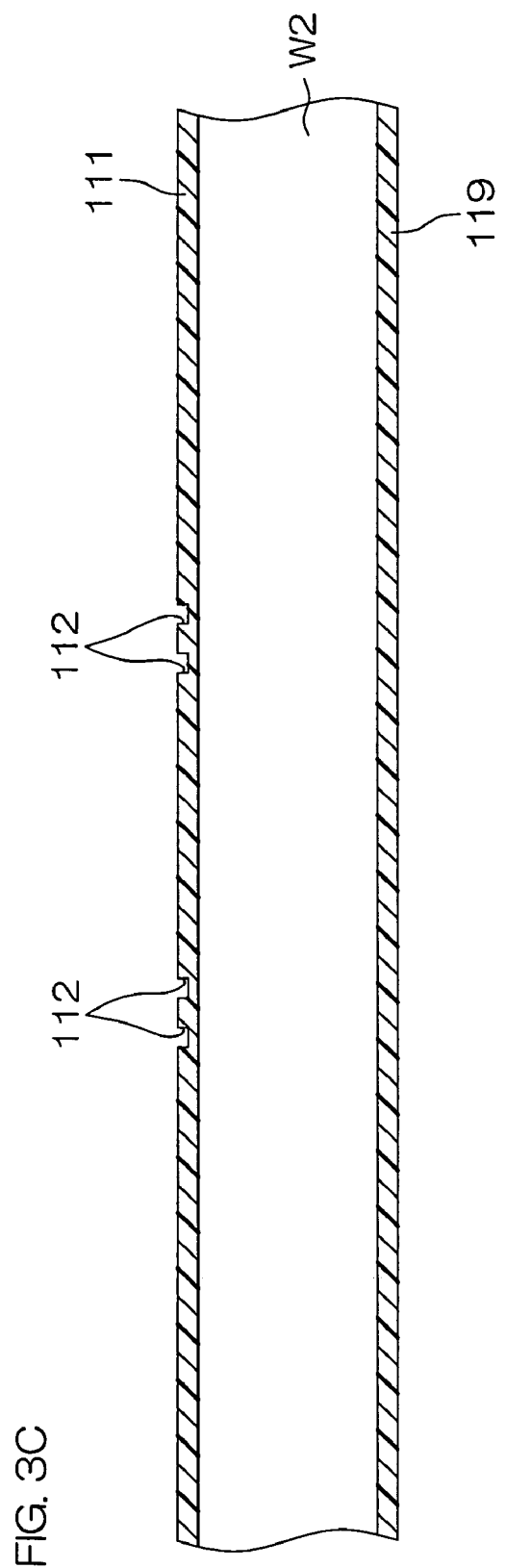
FIGS. 3A to 3K are schematic sectional views successively showing the steps of producing a conventional Si microphone.
Figure 3E:
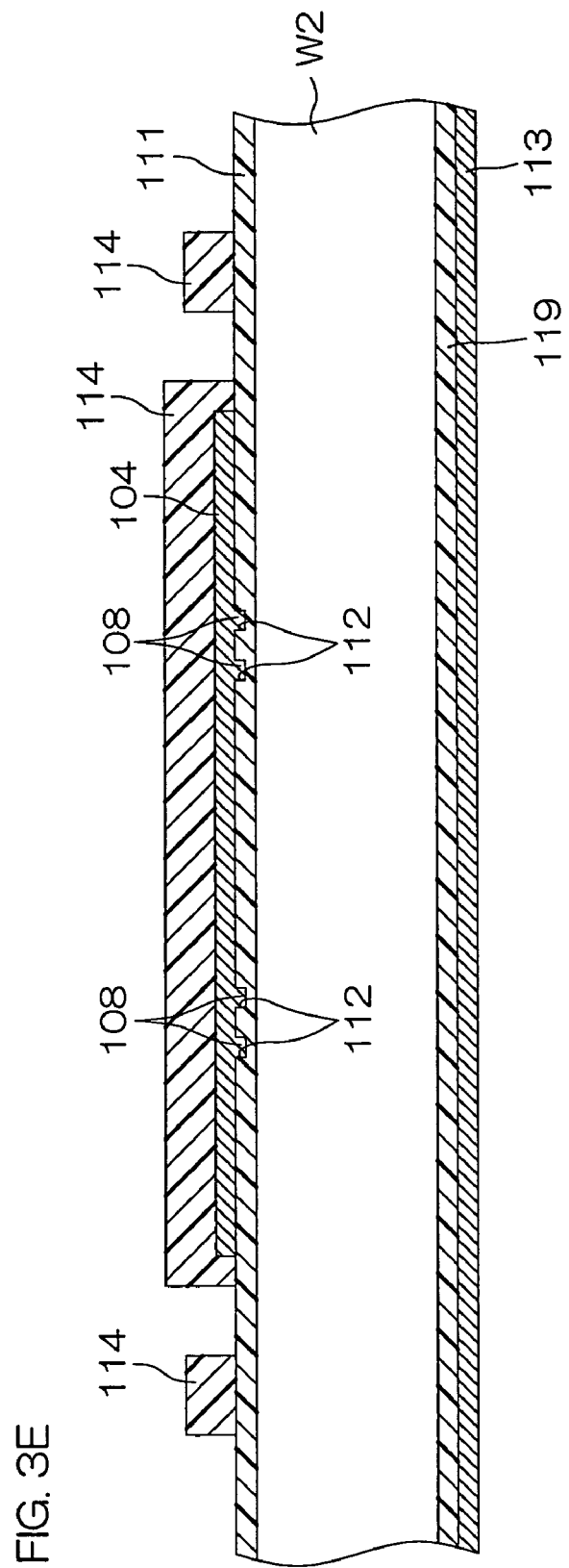
Figure 3:
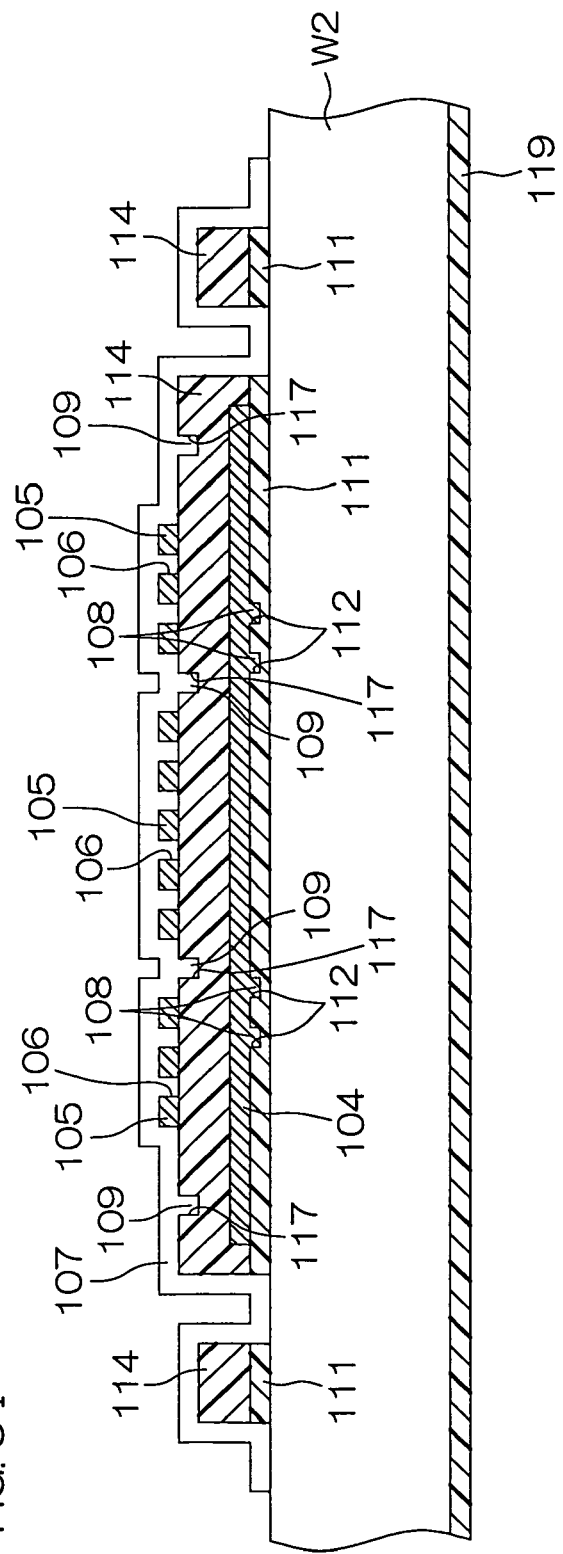

Thereafter etching gas (chlorine-based gas such as $BCl_3$ (boron trichloride), for example) is supplied to the upper sacrificial layer 34 through the upper through-holes 18, to dry-etch the upper sacrificial layer 34 (step of removing the second sacrificial layer). Thus, the upper sacrificial layer 34 is removed and the cavity 20 is formed between the lower thin film 5 and the upper tin film 6, as shown in FIG. 2H.

Then, etching gas (chlorine-based gas such as $BCl_3$ (boron trichloride), for example) is supplied to the lower sacrificial layer 30 through the upper through-holes 18, the cavity 20 and the lower through-holes 12. The chlorine-based gas such as $BCl_3$ easily chemically reacts with the Al component contained in Al—Si forming the lower sacrificial layer 30. Therefore, Al is preferentially etched in the lower sacrificial layer 30 supplied with the etching gas. After the etching gas is supplied for a prescribed time (necessary for entirely removing the Al component from the lower sacrificial layer 30, for example), the supply of the etching gas is stopped. Thus, the Al component is removed from the lower sacrificial layer 30 and the cavity 19 is formed between the Si wafer W1 and the lower thin film 5, while the material other than Al (component other than the Al component: Si in this embodiment) forming the lower sacrificial layer 30 remains on the opposed region 41 of the upper surface 29 of the Si substrate 2 as the plurality of protrusions 39, as shown in FIG. 2H (step of removing a prescribed material from the first sacrificial layer).

Then, the Si wafer W1 is divided into the size of the Si substrate 2, whereby the Si microphone 1 shown in FIG. 1 is obtained. The portions of the third insulating layer 15 having entered the recesses 35 and 40 of the upper sacrificial layer 34 become the protrusions 17 protruding toward the recesses 11 (lower through-holes 12), to function as the stoppers for preventing the upper thin film 6 and the lower thin film 5 from adhesion.

According to this embodiment, as hereinabove described, the lower sacrificial layer 30 made of Al—Si is formed on the upper surface 29 of the Si wafer W1. The lower thin film 5 having the plurality of recesses 11 and the plurality of lower through-holes 12 in the form of matrices is formed on the lower sacrificial layer 30. Further, the upper sacrificial layer 34 is formed on the lower thin film 5, and the upper thin film 6 having the plurality of upper through-holes 18 in the form of a matrix communicating with the lower through-holes 12 is formed on the upper sacrificial layer 34. Then, the upper sacrificial layer 34 is removed by dry etching through the upper through-holes 18. The Al component contained in Al—Si forming the lower sacrificial layer 30 is removed by dry etching through the upper through-holes 18 and the lower through-holes 12, after the removal of the upper sacrificial layer 34.

The lower sacrificial layer 30 is made of Al—Si, whereby the cavity 19 is formed between the Si wafer W1 and the lower thin film 5 due to the removal of the Al component from the lower sacrificial layer 30, while the plurality of protrusions 39 made of Si remain on the opposed region 41 of the upper surface 29 of the Si substrate 2. The protrusions 39 remaining on the upper surface 29 of the Si substrate 2 come into contact with the lower surface of the lower tin film 5 when the lower thin film 5 approaches the Si substrate 2, to function as stoppers preventing the lower thin film 5 and the Si substrate 2 from adhesion.

Thus, according to this embodiment, the protrusions 39 for preventing the Si substrate 2 and the lower thin film 5 from retention of contact (adhesion) without carrying out steps of forming a photoresist film having a plurality of holes on the lower sacrificial layer 30 and forming recesses in the lower sacrificial layer 30 by etching through the photoresist film employed as a mask. In other words, the time and labor necessary for forming the protrusions 39 can be reduced.

Further, Al which is the component (removed component) removed from the lower sacrificial layer 30 by etching is employed as the material for the upper sacrificial layer 34.

If the material for the upper sacrificial layer 34 and the removed component in the lower sacrificial layer 30 are identical to each other (Al in this embodiment), the Al component can be removed from the lower sacrificial layer 30 following the removal of the upper sacrificial layer 34 with the same etching gas (chlorine-based gas such as $BCl_3$ (boron trichloride) in this embodiment) through a series of steps. Consequently, the time and labor necessary for producing the Si microphone 1 can be further reduced.

While the embodiment of the present invention has been described, the present invention can also be carried out in other embodiments.

For example, the upper sacrificial layer 34 may alternatively be made of another material such as SiN (silicon nitride), so far as the material can be etched and has an etching selection ratio with the lower thin film insulating layer 7 and the upper thin film insulating layer 13.

The lower thin film insulating layer 7 and the upper thin film insulating layer 13 may alternatively be made of another material such as SiN, for example, so far as the same is an insulating material. When the lower thin film insulating layer 7 and the upper thin film insulating layer 13 are made of a material other than $SiO_2$, the upper sacrificial layer 34 may be made of $SiO_2$.

The MEMS sensor according to the present invention is not restricted to the Si microphone, but may be applied to a pressure sensor or an acceleration sensor operating by sensing a change in capacitance.

Although the embodiments of the present invention are described in detail, these embodiments are merely specific examples used for clarifying the technical contents of the present invention. Therefore, the present invention should not be construed as being limited in any way to these specific examples. The spirit and scope of the present invention are limited only by the scope of the appended claims.

This application corresponds to Japanese Patent Application No. 2007-192202 filed with the Japanese Patent Office on Jul. 24, 2007, the full disclosure of which is incorporated herein by reference.

What is claimed is:

1. An MEMS sensor including:
   a substrate;
   a lower thin film, opposed to a surface of the substrate at an interval, having a plurality of lower through-holes formed to pass through the lower thin film in the thickness direction thereof and a lower electrode arranged in the lower thin film;
   an upper thin film, opposed to the lower thin film at an interval on the side opposite to the substrate, having a plurality of upper through-holes formed to pass through the upper thin film in the thickness direction thereof, and an upper electrode arranged in the upper thin film; and
   a plurality of protrusions irregularly provided on a region of the surface of the substrate opposed to the lower thin film.

2. The MEMS sensor according to claim 1, wherein the lower thin film has a lower thin film insulating layer covering the lower electrode.

3. The MEMS sensor according to claim 2, wherein the lower thin film insulating layer has a first insulating layer forming a lower layer of the lower thin film insulating layer and a second insulating layer formed on the first insulating layer as an upper layer of the lower thin film insulating layer.

4. The MEMS sensor according to claim 1, wherein the upper thin film has an upper thin film insulating layer covering the upper electrode.

5. The MEMS sensor according to claim 4, wherein
   the upper thin film insulating layer has a third insulating layer forming a lower layer of the upper thin film insulating layer and a fourth insulating layer formed on the third insulating layer as an upper layer of the upper thin film insulating layer, and
   the third insulating layer has a protrusion portion protruding toward the lower thin film.

6. The MEMS sensor according to claim 1, wherein the upper electrode has a protrusion portion protruding toward the lower thin film.

7. The MEMS sensor according to claim 1, wherein the upper electrode is in a form of a mesh.

8. The MEMS sensor according to claim 1, further including:
   a sensor portion, having the lower thin film and the upper thin film, arranged to generate an electric signal responsive to a change of capacitance resulting from a vibration of the upper thin film, and a pad portion, having a wiring for receiving the electric signal generated by the sensor portion, arranged to output the electric signal received by the wiring to outside, wherein the lower electrode and the wiring of the pad portion are formed integrally.

9. The MEMS sensor according to claim 1, further including:

a sensor portion, having the lower thin film and the upper thin film, arranged to generate an electric signal responsive to a change of capacitance resulting from a vibration of the upper thin film, and a pad portion, having a wiring for receiving the electric signal generated by the sensor portion, an insulating layer having an opening partially exposing the wiring as a pad and a metal thin film covering the wiring exposed from the opening, and arranged to output the electric signal received by the wiring to outside, wherein the upper electrode and the metal thin film of the pad portion are formed integrally.

10. The MEMS sensor according to claim 1, wherein the protrusions are made of Si.

* * * * *